United States Patent [19]

Keen

[11] 4,209,894
[45] Jul. 1, 1980

[54] FUSIBLE-LINK SEMICONDUCTOR MEMORY

[75] Inventor: Ralph S. Keen, Missouri City, Tex.

[73] Assignee: Texas Instruments Incorporated, Dallas, Tex.

[21] Appl. No.: 900,550

[22] Filed: Apr. 27, 1978

[51] Int. Cl.² ............................................. B01J 17/00
[52] U.S. Cl. .................................. 29/577 R; 29/580; 29/591
[58] Field of Search ................. 29/580, 589, 590, 591, 29/577

[56] References Cited

U.S. PATENT DOCUMENTS 3,539,705  11/1970  Nathanson ........................... 29/580
4,032,949  6/1977   Bierig ................................. 29/574

Primary Examiner—W. C. Tupman
Attorney, Agent, or Firm—John G. Graham

[57] ABSTRACT

A programmable read only memory array of the fusible link type employs a small part of a deposited metal film as a fuse. The film is covered by a protective glaze which seals the surface of the semiconductor chip to avoid deterioration of the transistors or other components. In order to minimize heat loss to the semiconductor substrate when programming, and to provide a cavity beneath the protective glaze, the metal film is raised above the surface at the position of the fusible link. This is accomplished by a segment of photoresist applied prior to metal deposition, then removed with photoresist stripper after the metal is patterned.

5 Claims, 7 Drawing Figures

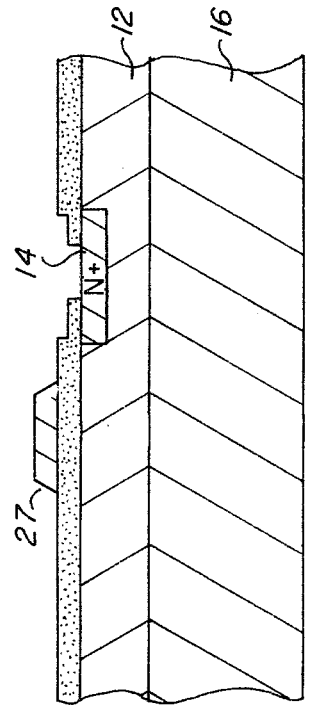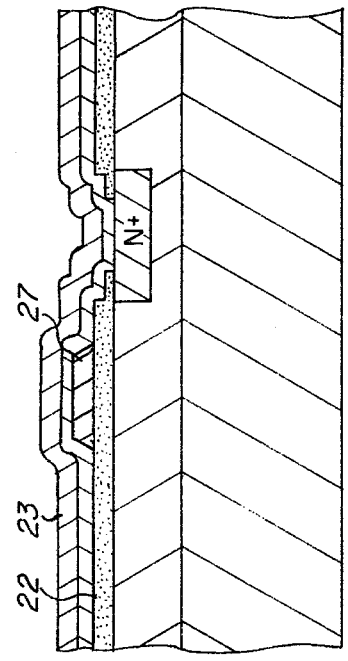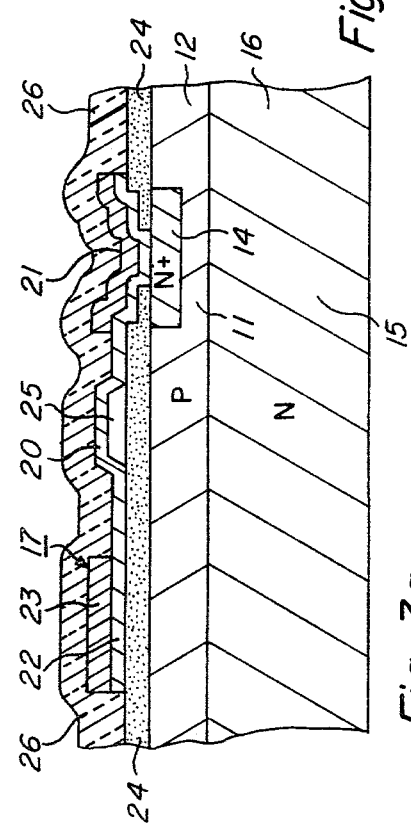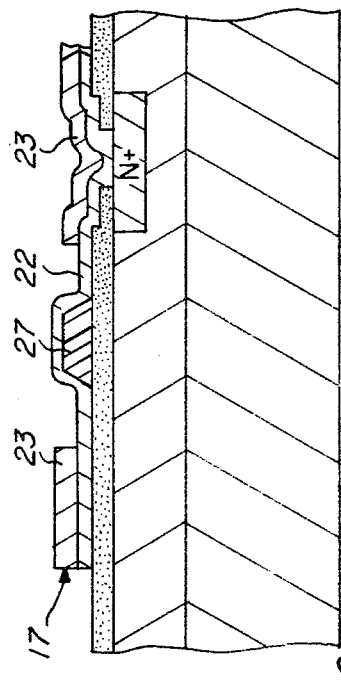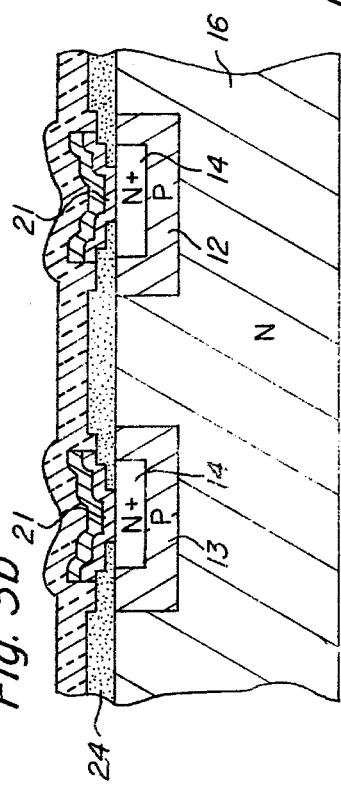

FUSIBLE-LINK SEMICONDUCTOR MEMORY

BACKGROUND OF THE INVENTION

This invention relates to semiconductor devices and methods of manufacture and more particularly to an improved fusible-link programmable read only memory.

Programmable read only memories or PROMs are used in microcomputers and similar digital systems. One of the types which is most widely utilized is the fusible-link PROM, wherein a small necked down portion of a metal conductor in each cell acts as a fuse and can be blown out by over-current selectively applied in order to program the memory. Usually the fusible-link is made of a thin film of a refractory metal such as titanium:tungsten. One of the problems with these devices is that the thin film is deposited on top of a coating of silicon oxide only a few tenths of a micron thick on a silicon substrate; the substrate acts as a heat sink so the heat generated by over-current in programming is conducted away. This requires much more current to be used than if a fuse of the same dimensions was freestanding and this current requires larger transistors on the chip. Another problem is that in the manufacture of transistors or diodes of the type needed in each cell of a PROM array and in the decoders and the like peripheral to the array on the chip, it is necessary to cover the semiconductor surface with a protective glaze to prevent deterioration. This glaze also covers the fusible-links and contains the melt when programming. This can cause unwanted shorts or low resistance.

It is therefore the principal object of the invention to provide an improved fusible-link PROM. Another object is to provide fusible-link PROMs which may be programmed with lower current, and which are more reliable.

SUMMARY OF THE INVENTION

In accordance with an embodiment of the invention, the fusible-links in a PROM array are raised above the underlying silicon oxide surface to provide thermal insulation from the substrate and to provide a cavity for melting the metal upon programming. This structure is obtained by defining small segments of photoresist on the silicon oxide surface prior to metal deposition. These segments are the areas to be the raised portions of the fusible links. After metal deposition and patterning, the segments are removed by using photoresist stripper, leaving freestanding parts of the metal film.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

FIGS. 3a and 3b are elevation views in section of the semiconductor bar of FIG. 1, taken along the lines a—a and b—b in FIG. 1; and FIGS. 4a–4c are elevation views in section corresponding to FIG. 3a showing the device at various stages of manufacture according to the invention.

Figure 1:
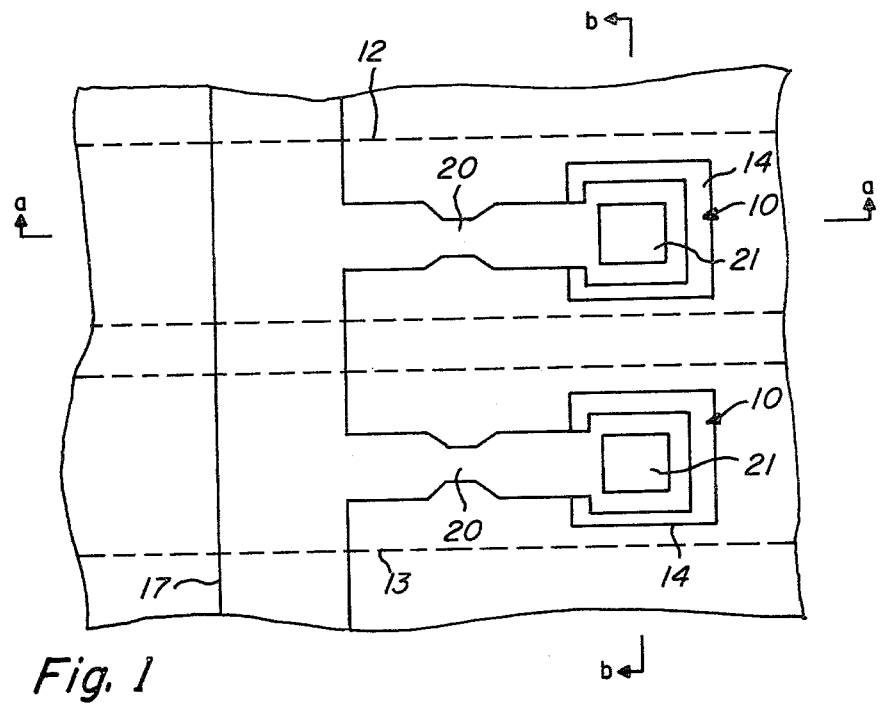
FIG. 1 is a greatly enlarged plan view of a part of a semiconductor chip having a PROM array formed therein according to the invention.
Figure 2:
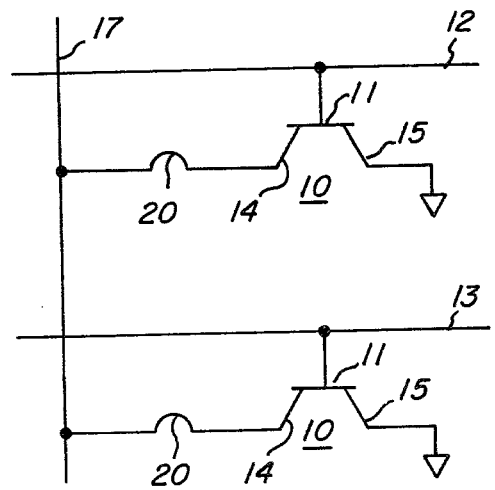
FIG. 2 is an electrical schematic diagram of the PROM array of FIG. 1.

Referring to FIGS. 1 and 2, a small part of a fusible-link PROM array according to the invention is illustrative. The array would contain perhaps 1024 cells on a silicon bar of less than about 100×100 mils, so the portion shown is only a few mils on a side. Each cell comprises an NPN transistor 10 wherein the base 11 is formed by one of the elongated diffused P-type regions 12 or 13, the emitter 14 is formed by a diffused N+ region, and the collector 15 is the substrate or silicon bar 16. The row lines are provided by elongated metal strips 17 and column lines by the elongated diffused P-type regions 12 and 13; the row and column lines are of course connected to row and column decoders so that one cell of the 1024 in the array may be selected for programming or for read out. All of the collectors 15 in the array are connected together and to a positive voltage supply.

The metal row lines 17 are connected to the emitters 14 by fusible metal links 20, usually composed of titanium:tungsten. As seen in the section views of FIGS. 3a and 3b, the metallization used for the row lines 17 and emitter contacts 21 is double level, the lower level 22 being a refractory metal or metal alloy, such as titanium:tungsten, and the upper level 23 being a thicker layer of aluminum. The segment of metallization having the fusible-link 20 therein is single level; it does not have the overlying aluminum layer 23 so its resistance will be much higher.

In accordance with the invention, the fusible-link 20 is raised above the surface of the silicon oxide layer 24 which was used as the diffusion mask in forming the transistors. This creates a gap 25 which thermally insulates the link 20 from the silicon oxide 24 and the substrate silicon 16. The gap 25 is perhaps one micron high and one or two tenths of mils long. The transverse width of the link 20 over the gap is about 0.05 mil.

The entire top face of the bar is covered with a protective overcoat 26 which is a glaze or silicon oxide deposited at low temperature. The coating 26 is needed to protect the device from deterioration due to humidity and various surface effects which occur even in hermetically sealed semiconductor devices. The overcoat 26 unfortunately contains the material and vapor when the fusible-links are blown, possibly causing shorts or low resistance bridges where open circuits should occur, this being due to the fact that in prior art devices the molten metal was constrained and could not ball up away from the blown portion. In the device made according to the invention, however, the molten metal and vapor has room in the void or gap to avoid these problems.

Turning now to FIGS. 4a–4c, a method of making the device of FIGS. 1, 3a and 3b will be described. After having performed the base and emitter diffusions by conventional means, the silicon oxide layer 24 remains as seen in FIG. 4a. A layer of photoresist is applied to the entire top surface of the slice and exposed to light through a mask and developed to leave small mounds or segments 27 where each of the gaps 25 are to exist. Then, a thin film 22 of refractory metal is deposited over the top surface and a film 23 of aluminum is deposited over the film 22, as seen in FIG. 4b. The aluminum is patterned by a photoresist operation, removing aluminum above the segment 27 and leaving the strips 17 and the contact areas above the emitters 14 as seen in FIG.

4c. Next, the refractory metal film 22 is paterned to remove all exposed parts except the strips 30 which include the fusible-links 20. The photoresist segments 27 are now exposed everywhere except beneath the small links 20, and all of this photoresist may be removed by a standard photoresist stripper solution, leaving the links suspended above the thermal oxide 24. Thereafter, the passivation coating 26 is applied. Nevertheless, the links 20 are still free to melt back since space below is available so the titanium:tungsten can ball up and pull back or can evaporate and condense out on the surfaces of the cavity.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a semiconductor device including the steps of applying a coating of photoresist to define a plurality of small segments, depositing a thin film of conductive material on said face and over the small segments, patterning the film to leave elongated strips extending across the segments of photoresist and exposing parts of the segments, thereafter removing the segments of photoresist to leave raised portions in the elongated strips and selectively applying excess current to some of the elongated strips to fuse the raised portions.

2. A method according to claim 1 wherein a plurality of semiconductor components are formed in said face, one for each of the elongated strips, and the elongated strips are formed to contact regions of the semiconductor components.

3. A method according to claim 2 including the step of forming a protective coating over the face of the semiconductor body after removing the segments.

4. A method according to claim 3 wherein the step of depositing a thin film of metallization includes depositing a thin film of a refractory metal over the whole face, and then depositing a thin film of a highly conductive metal over the film of refractory metal, and wherein the step of patterning the metallization includes removing the highly conductive metal from the areas which are to be the raised portions and leaving the highly conductive metal in parts of the elongated strips away from the raised portion.

5. A method according to claim 1 wherein the semiconductor device is a programmable read only memory and wherein the excess current, selectively applied to some of the elongated strips to fuse the raised portions, functions to program the read only memory.

* * * * *